United States Patent [19]

Duncan et al.

[11] Patent Number: 4,862,510
[45] Date of Patent: Aug. 29, 1989

[54] LEAD SENSE SYSTEM FOR COMPONENT INSERTION MACHINE

[75] Inventors: Robert J. Duncan, Magnolia; Jean A. McLean, South Hamilton, both of Mass.

[73] Assignee: Emhart Industries, Inc., Farmington, Conn.

[21] Appl. No.: 29,834

[22] Filed: Mar. 24, 1987

[51] Int. Cl.[4] .............................................. G06K 9/00
[52] U.S. Cl. ........................................ 382/8; 250/561; 358/101; 358/106; 364/468
[58] Field of Search ..................... 382/8, 34; 356/375, 356/380, 390; 358/101, 106, 107; 364/468, 470, 490; 250/561, 562

[56] References Cited

U.S. PATENT DOCUMENTS

| | | | |
|---|---|---|---|
| 4,450,579 | 5/1984 | Nakashima et al. | 356/375 |
| 4,464,833 | 4/1984 | Duncan | 364/490 |
| 4,549,087 | 10/1985 | Duncen et al. | 382/8 |
| 4,686,565 | 8/1987 | Ando | 358/101 |
| 4,696,047 | 9/1987 | Christian et al. | 358/106 |
| 4,739,175 | 4/1988 | Tamura | 250/561 |
| 4,772,125 | 9/1988 | Yoshimura et al. | 358/106 |

*Primary Examiner*—Boudreaul Leo H.
*Assistant Examiner*—Joseph Mancuso
*Attorney, Agent, or Firm*—Spencer T. Smith

[57] ABSTRACT

Method and apparatus are disclosed for analyzing an image produced by a camera focused on the leads of a component that have been inserted into a printed circuit board by a component insertion machine. The method and apparatus include the construction of arrays of information pertaining to individual leads that should be present in the image produced by the camera. Individual strings of pixel information in the form of binary encoded bits within each array are analyzed for the presence of a pattern of bits that would indicate a lead. The method and apparatus are operative with resepct to a pixel resolution that may only produce a single properly encoded bit per width of inserted lead.

3 Claims, 15 Drawing Sheets

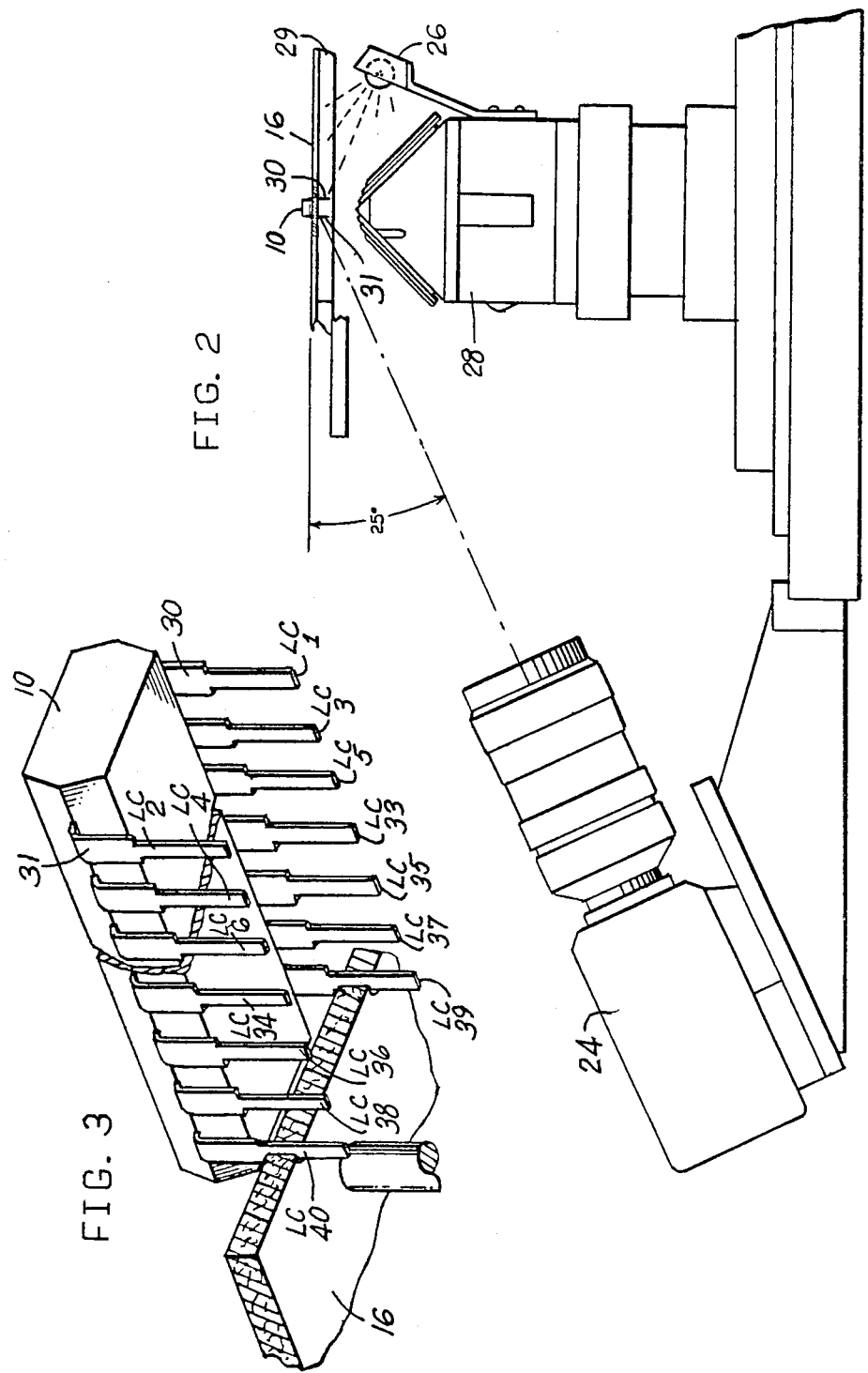

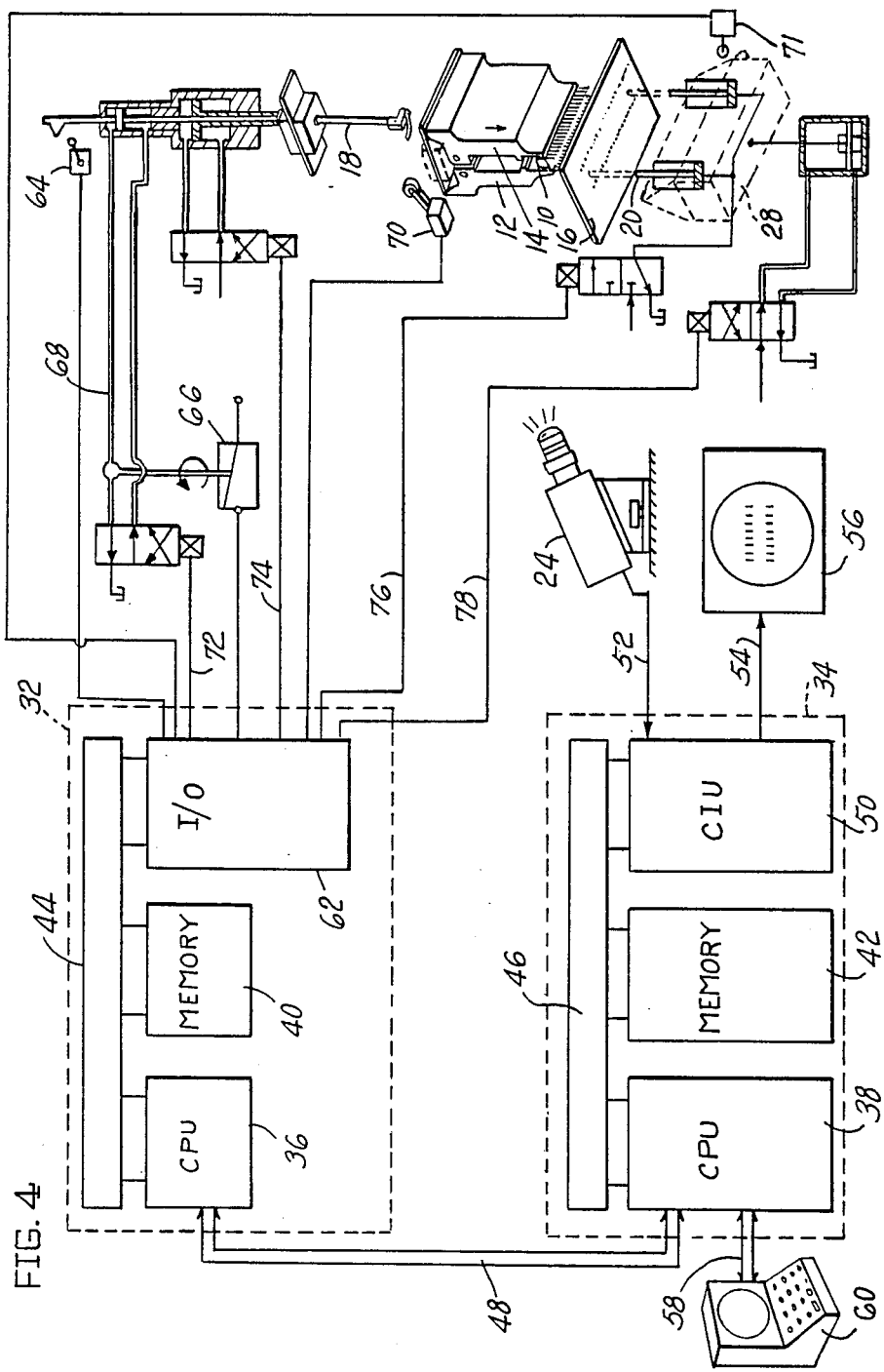

LEAD SENSE SYSTEM FOR COMPONENT INSERTION MACHINE

FIELD OF THE INVENTION

This invention relates to the inserting of leads of an electrical component into the holes of a printed circuit board. In particular, this invention relates to the sensing of the inserted leads by a remotely located camera within a component insertion machine.

BACKGROUND OF THE INVENTION

The sensing of leads inserted through the holes of a printed circuit board using a remotely located camera within a component insertion machine is disclosed in U.S. patent application Ser. No. 797,322, entitled "Lead Sense System for Component Insertion Machine" filed on Nov. 12, 1985. The disclosed system is premised on analyzing a stored electronic image of the inserted leads. The stored electronic image consists of a matrix of pixel bits representing in binary the image field defined by the focused camera. The analysis consists of examining successive partial rows of pixel bits for the presence of at least two adjacent bits having the same predetermined binary value. The bit adjacency is assumed to indicate the detection of a width of an inserted lead. The bit adjacency criteria must be met for a predetermined number of successive rows of pixel bits before a lead is concluded to be present.

The above analysis is premised on a pixel resolution sufficient to allow for a number of pixels to be dedicated to defining the width of a lead. If the number of pixels per width of lead is not sufficiently high, then the algorithm will not reliably detect the presence of an inserted lead. This happens in particular when using the image analysis system disclosed in the aforementioned U.S. patent application Ser. No. 797,322 for a larger field of focus accommodating many more inserted leads that are to be detected.

OBJECTS OF THE INVENTION

It is an object of the invention to provide method and apparatus within a lead sense system in a component insertion machine which reliably analyze a binary encoded image of the inserted leads of a component wherein the image may not produce a sufficient number of pixel bits per width of lead so as to allow for a bit adjacency test of successive rows of pixel bits.

It is another object of the invention to provide method and apparatus within a lead sense system in a component insertion machine which reliably sense the presence or absence of a lead from stored pixel information wherein only one pixel of information may be relied upon for defining the width of a lead.

SUMMARY OF THE INVENTION

The above and other objects are achieved according to the present invention by a camera based lead sense system having method and apparatus which store a matrix of pixel bits representative of inserted leads extending beneath a circuit board. The stored matrix of pixel bits may contain only a single pixel bit per width of lead. In accordance with the invention, the system extracts pixel bits from the stored matrix and forms small window arrays of pixel bits that are specifically analyzed for the presence of leads. Columns of bits within each thus formed window array are examined for a pattern of successive bits that indicate the presence of a lead. The pattern can be present in either a single column or in adjacent columns. The pattern need only have a single bit indicating the presence of a lead at a given bit location in the adjacent columns. The system authorizes a cut and clinching of leads in the event that all leads are determined to be present following the image analysis.

BRIEF DESCRIPTION OF THE DRAWINGS

The above and other features of the invention will now be particularly described with reference to the accompanying drawings in which:

FIG. 2 is a front view of the camera oriented toward the underside of the printed circuit board;

FIG. 3 is a close-up view of a component having lead extending down through the printed circuit board;

FIG. 4 is a block diagram of a system associated with the camera and various other elements of a component insertion machine;

DESCRIPTION OF THE PREFERRED EMBODIMENT

Figure 1:
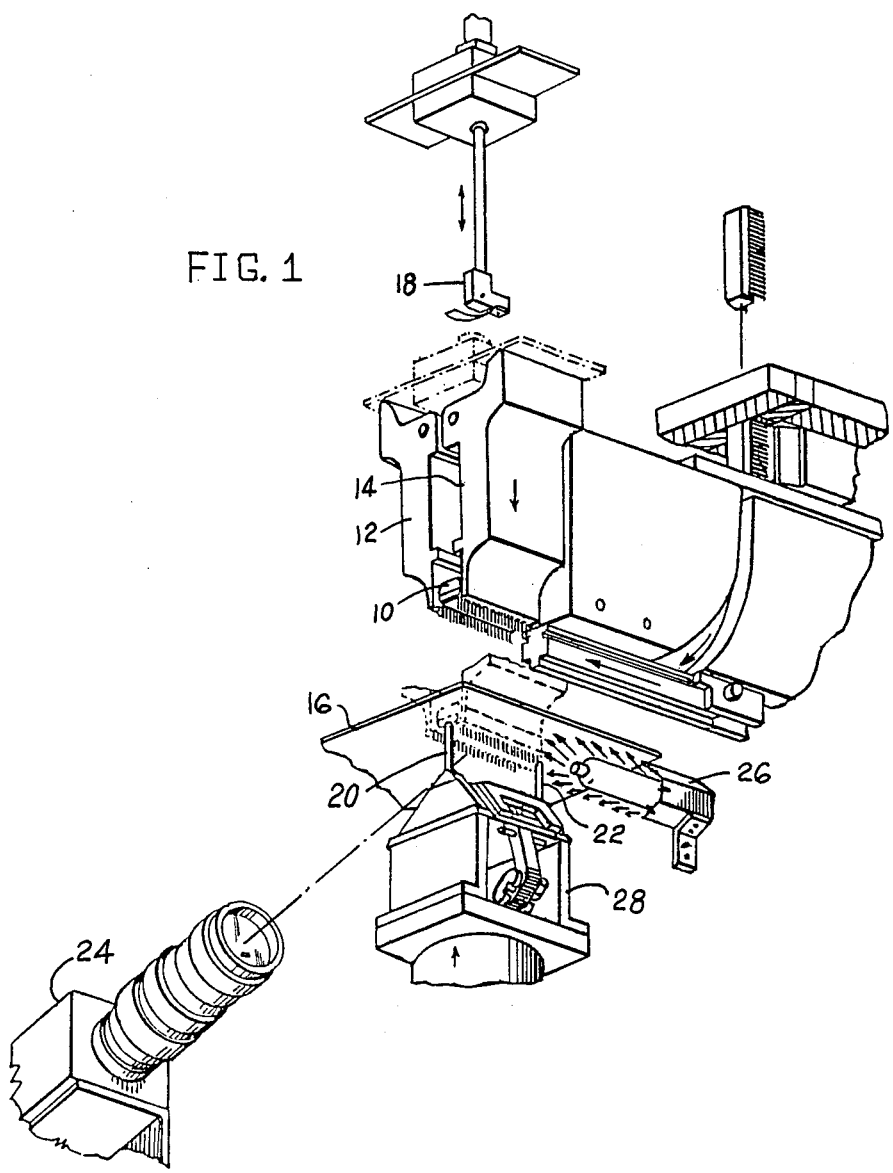
FIG. 1 is a perspective view of a camera oriented toward the underside of a printed circuit board within a component insertion machine.

Referring to FIG. 1, an electrical component 10 having leads extending therefrom is held by a pair of finger grippers 12 and 14 above a printed circuit board 16. It is to be understood that the finger grippers 12 and 14 are part of an insertion head mechanism within a component insertion machine. This mechanism moves downwardly toward the previously positioned printed circuit board 16 in a manner well understood in the art. In this regard, the leads extending from the component 10 will be inserted into appropriate holes within the printed circuit board 16 at the end of the downward stroke. At this time, the grippers 12 and 14 will pivot outwardly and a pusher element 18 will move downwardly into contact with the component 10. The pusher element will exert a downward force on the component that is sufficient to fully insert the leads into the holes of the printed circuit board.

In accordance with the invention, a pair of printed circuit board support columns 20 and 22 will move upwardly into supporting contact with the underside of the printed circuit board 16. The printed circuit board 16 will thus be supported from underneath when the pusher element 18 seats the component 10 in position against the printed circuit board 16. A picture of the thus inserted leads extending from the underside of the printed circuit board 16 is now taken by a solid state camera 24. The camera 24 is physically attached to the frame of the component insertion machine at a location remote from the inserted leads. In particular, the camera is preferably located at an angle of twenty-five degrees with respect to the horizontal. The immediate area underneath the printed circuit board 16 which the camera is thus centered on is illuminated by a light source 26 positioned opposite the camera 24. The light source 26 is preferably a horizontal lamp which fully illuminates the downwardly extending leads of the component 10. In accordance with the invention, an analysis is made of the illuminated image of the downwardly extending leads. If all leads are verified as being present, then the board supports 20 and 22 are retracted and a cutting and clinching mechanism 28 is moved upwardly into operative position with respect to the downwardly extending leads.

Referring to FIG. 2, a front elevational view of the camera 24 is illustrated relative to the light source 26 and the cut and clinch mechanism 28. The center of the camera lens preferably lies on a twenty-five degree centerline passing through the mid-point of the component 10. The distance at which the camera is located along the angled centerline from the component insertion machine is dictated by the constraints of the component insertion machine and where the camera can be suitably mounted.

The light source 26 is positioned on the opposite side of the cut and clinch mechanism 28 and immediately below the supporting table 29 for the printed circuit board. The positioning of the light source 26 with respect to the leads of the component allows for the projection of an appropriately illuminated image onto the lens of the camera 24. In this regard, the leads will appear to the camera as dark shadows relative to a white background.

It is important that the lens and electronics of the camera have sufficient resolution so as to adequately define the thus projected image. In this regard, the camera lens must have a focused field of vision of approximately one inch vertically by two inches horizontally so as to include all leads of a maximum sized component. The camera electronics must furthermore be capable of forming an electronic image of each lead within this field of vision. The electronics within the camera 24 preferably include discrete light sensitive elements each producing a pixel of information having a resolution of approximately six thousandths of an inch. Such a pixel resolution will optimally produce three pixels of information defining a minimum width of an inserted lead which may be only eighteen thousandths of an inch. It is to be understood however that lighting and other factors may dictate that less than all three pixels of information will actually indicate the width of a lead. In this regard, the edges of a lead may produce gray pixel information as opposed to totally dark pixel information. This may result in, for instance, only one pixel of information being dark enough to be interpreted accurately as a lead width.

Referring now to FIG. 3, the largest size of the component 10 is illustrated relative to the printed circuit board 16 and the board support 22. The component is seen to have a maximum of forty leads with twenty leads extending downwardly from each long side of the component. The long side of the component farthest from the camera 24 is seen to have the component lead 30 extending downwardly therefrom whereas the long front side of the component is seen to have the component lead 31 extending downwardly therefrom. Referring to FIG. 2, it is to be appreciated that the distance of the leads 30 and 31 from the camera will vary slightly depending on the width of the component. In this regard a larger width component will place the leads along the front side closer to the camera while at the same time placing the leads along the back side further away from the camera than a smaller width component. This will produce slightly different lead images to the camera depending on the width of the component. This difference in where the lead image may occur as a function of component width will be further discussed hereinafter.

In accordance with the practice used herein for counting leads, lead 30 will be the first lead to be counted whereas lead 31 will be the second. The third lead to be counted will be the lead adjacent to lead 30 along the backside of the component whereas the fourth lead to be counted will be the lead adjacent to lead 31 along the front side of the component. Successive lead counts are indicated in FIG. 3 by the "LC" labels.

Referring now to FIG. 4, two separate computer systems are illustrated relative to certain previously described elements of FIG. 1. In particular, a machine control system 32 is illustrated relative to certain elements of the component insertion machine described in FIG. 1, whereas an image analysis system 34 is illustrated relative to the camera 24. Each system comprises a central processor unit, such as CPU 36 for the machine control system, and CPU 38 for the image analysis system. These central processor units are preferably Intel 8080 microprocessors which interface with randomly addressable memories 40 and 42 via Intel multibus circuitry 44 and 46. The central processor units 36 and 38 communicate with each other via a multiple line databus 48.

Referring to the image analysis system 34, the central processor unit 38 addresses a camera interface unit (CIU) 50 via the multibus 46. The CIU 50 is preferably a standard interface for a charge coupled device type of solid state camera. Such devices are available from various analog to digital product manufacturers, i.e., for example, Data Cube, Inc. of Peabody, Mass. A particular camera interface unit from Data Cube which may be used is a VG-132. The charge coupled device camera 24 is connected to the camera interface unit 50 via a line 52 which is a standard RS 170 line. Following receipt of an authorization from the central processor 38, the camera interface unit 50 will automatically proceed to look for a synchronizing signal from the camera on the line 52. The CIU will thereafter store binary coded information defining an array of pixels numbering 384 horizontally by 242 vertically. In this regard, the camera interface unit will read an analog signal depicting the voltage level of each pixel. The camera interface unit 50 will arbitrarily assign a binary value to the thus read signal based on a predefined threshold value which divides that which is to be regarded as light (binary 0) from that which is to be regarded as dark (binary 1). The resulting pixel bits are stored within an internal memory of the camera interface unit 50 for later use by the central processor unit 38.

Figure 5:
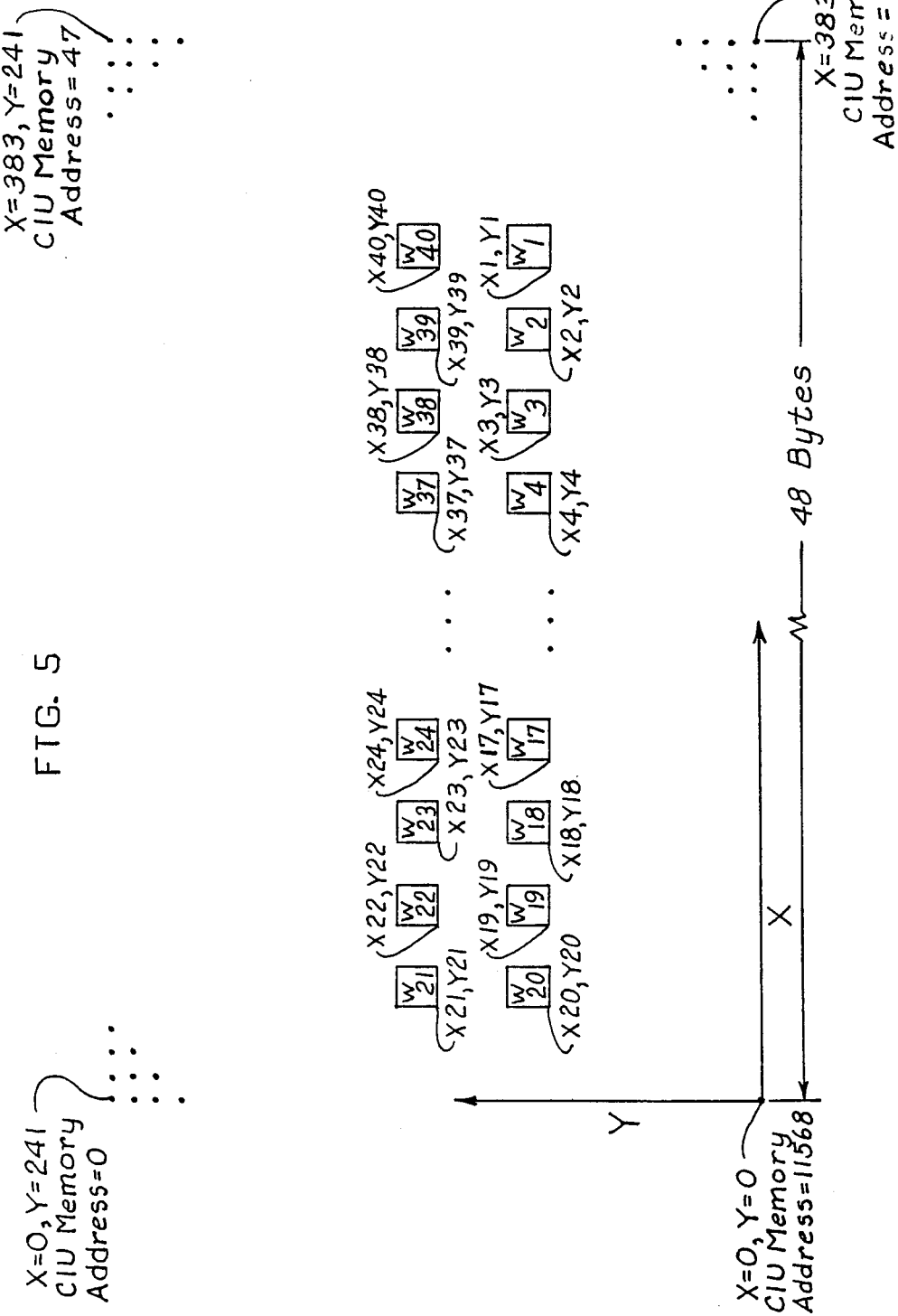
FIG. 5 illustrates the image field of the camera that is to be analyzed by the system of FIG. 4.

Referring now to FIG. 5, an X, Y coordinate system is set forth which defines the location of each pixel within the aforementioned array of 384 by 242 pixels. The Y-coordinate defines 242 successive rows of pixels beginning at Y equals zero and extending to Y equals 241. The pixel locations within each row begin at X equals zero and extend to X equals 383.

The address location within the CIU 50 for each stored pixel bit corresponding to a pixel located at one of the four corners of the array of pixels is also shown in FIG. 5. In this regard, the address locations are indicated for addressable eight bit bytes of information stored within a randomly addressable memory in the CIU 50. The first eight bit byte having a CIU memory address of zero contains, as its most significant bit, the pixel bit corresponding to the pixel located at X equals zero, Y equals 241. Since there are 384 pixel bits in a row, there will be forty-eight bytes of information in a given row. The memory address of 47 will hence define the last addressable byte in the Y equals 241 row and the least significant bit of this addressable byte will correspond to the pixel bit for the pixel occupying the coordinate position of X equals 383 and Y equals 241. In a similar fashion, the addressable byte containing the pixel bit for the pixel located at X equals zero, equals zero will have a memory address of 11568 whereas the CIU memory address for X equal to 383, Y equal to zero will be 11615. It is to be noted from the above that an address may be calculated for the first byte of information within a given row of bits defined by the Y-coordinate as follows: memory address equals $48(241-Y)$.

A set of windows labeled $W_1$ through $W_{40}$ is illustrated in FIG. 5 relative to the X, Y coordinate system. Each window is seen to have a specific $X_i, Y_i$ coordinate defining the left corner of the window. The location of each window as defined by its respective $X_i, Y_i$ coordinate should coincide with a lead on the maximum size of component 10 set forth in FIG. 3. In this regard, a portion of each of the leads having lead counts $LC_1$ through $LC_{40}$ in FIG. 3 should appear within a respective window $W_i$. Referring to FIG. 3, it is to be noted that the index, "I", for the windows $W_i$ does not however correspond to the lead count numbering for the leads. It is therefore necessary to provide the following correlation between the windows, $W_i$ and the lead counts of FIG. 3:

| WINDOW CORRELATION TABLE | |
|---|---|
| LEAD COUNT LC | WINDOW INDEX, I |
| 1 | 1 |
| 2 | 40 |
| 3 | 2 |
| 4 | 39 |
| 5 | 3 |
| 6 | 38 |
| 7 | 4 |
| 8 | 37 |
| 9 | 5 |
| 10 | 36 |
| 11 | 6 |
| 12 | 35 |
| 13 | 7 |
| 14 | 34 |
| 15 | 8 |
| 16 | 33 |
| 17 | 9 |
| 18 | 32 |
| 19 | 10 |
| 20 | 31 |
| 21 | 11 |
| 22 | 30 |
| 23 | 12 |
| 24 | 29 |
| 25 | 13 |
| 26 | 28 |
| 27 | 14 |
| 28 | 27 |
| 29 | 15 |
| 30 | 26 |
| 31 | 16 |
| 32 | 25 |
| 33 | 17 |
| 34 | 24 |
| 35 | 18 |
| 36 | 23 |
| 37 | 19 |
| 38 | 22 |
| 39 | 20 |
| 40 | 21 |

It is to be appreciated from the above that a window for a given lead is identified by knowing the lead count for that lead and then going to the window correlation table and obtaining the window index number, I.

As has been previously discussed, each window $W_i$ will have a left corner coordinate $X_i, Y_i$. These coordinates are initially defined in a table of coordinate values as a set of coordinates for each respective window index number. The initial coordinates are such as to space the windows relative to the center of the field of vision of the camera lens so that a camera mounted along the centerline of FIG. 2 should produce an image of leads falling within the windows. In this regard the leads such as 30 extending from the back side of the component should appear in the windows $W_1$ through $W_{20}$ whereas the leads such as 31 extending along the front side of the component should appear in the windows $W_{21}$ through $W_{40}$. As has been previously discussed, the leads along the front and back side of the component will produce slightly different images to the camera 24 depending on the width of the component. This would result in a different spacing of the windows, especially in the Y-coordinate direction. It is to be understood that the invention contemplates different sets or tables of initial coordinate values for the windows depending on the width size of the component. It is furthermore to be appreciated that these sets or tables of initial coordinates can be calculated and thereafter stored as sets of values to be retrieved for a given width of component.

Each window having its particular coordinate values is preferably eight pixel locations in width by eight pixel locations in height. A lead appearing within a given window should appear as a dark object with respect to a white background defined by the back lighting. The lead length should extend from top to bottom of the window. The lead width of eighteen thousandths should produce three dark pixels along the horizontal window width. It is to be noted, however, that the edges of the leads may appear grey to the camera as a result of the white background lighting. This may result in less than three dark pixels being present along a given horizontal width of a window. The CIU 50 may therefore have encoded only one pixel bit as a binary one indicative of a truly dark pixel having been produced by the camera 24. The stored pixel bits for a given lead for a given window may therefore consist of a thin lead image from top to bottom consisting of possibly only one properly encoded binary one pixel bit per width of lead. As will be explained in detail hereinafter, all stored pixel bits for a given window can be accessed by addressing appropriate bytes of information and isolating the appropriate pixel bits within the thus addressed bytes.

Referring again to FIG. 4, it is to be noted that the camera interface unit 50 is directly connected via an RS 170 output line 54 to a monitor 56. The monitor 56 merely produces a black and white image representing the stored pixel bits of information in the CIU 50.

Referring now to the image analysis system 34 in FIG. 4, it is seen that the central processor unit 38 communicates via a bus 58 with a terminal 60. The bus 58 is preferably a three wire bus allowing for normal eight bit ASCII coded communications to the central processor unit 38.

Referring now to the machine control system 32, the central processor unit 36 addresses a particular input/output function of an input/output (I/O) circuit 62 via the multibus 44. In this manner, the central processor unit 36 monitors and/or controls certain functions of the component insertion machine. It is to be understood that the machine control system 32 encompasses considerably more than the specific machine control functions that are depicted in FIG. 5. In this regard, only those machine control functions that interrelate with the image analysis system 34 are particularly illustrated.

The first machine control function to be monitored is that of a switch 64 which trips when the pusher element 18 moves to its downward position against the component 10. A pressure sensitive switch 66 also provides a signal to the I/O circuit 62. In this regard, the pressure sensitive switch 66 monitors the pressure in a pneumatic line 68 associated with the pneumatic drive for the pusher element 18. The input/output circuit 62 is seen to also be connected to a switch 70 which trips when the grippers 12 and 14 move to the downward position so as to position the component 10 with respect to the board 16. The input/output circuit 62 is also seen to be connected to a switch 71 which trips when the cut and clinch mechanism 28 has moved upwardly into place for cutting and clinching the leads.

The I/O circuit 62 is also connected to various solenoid controlled valves which control the pneumatic pressures to various machine elements. In this regard, a line 72 provides a control signal to a solenoid controlled valve associated with the pneumatic system for the pusher element 18. A drive line 74 provides a control signal to a solenoid controlled valve associated with the pneumatic system for the component insertion head which houses the grippers 12 and 14. A line 76 provides a command signal to a solenoid controlled valve associated with a pneumatic drive for the supports 20 and 22. Finally, a command is provided over a line 78 to a solenoid controlled valve associated with the pneumatic drive for elevating the cut and clinch mechanism 28.

Figure 6A:
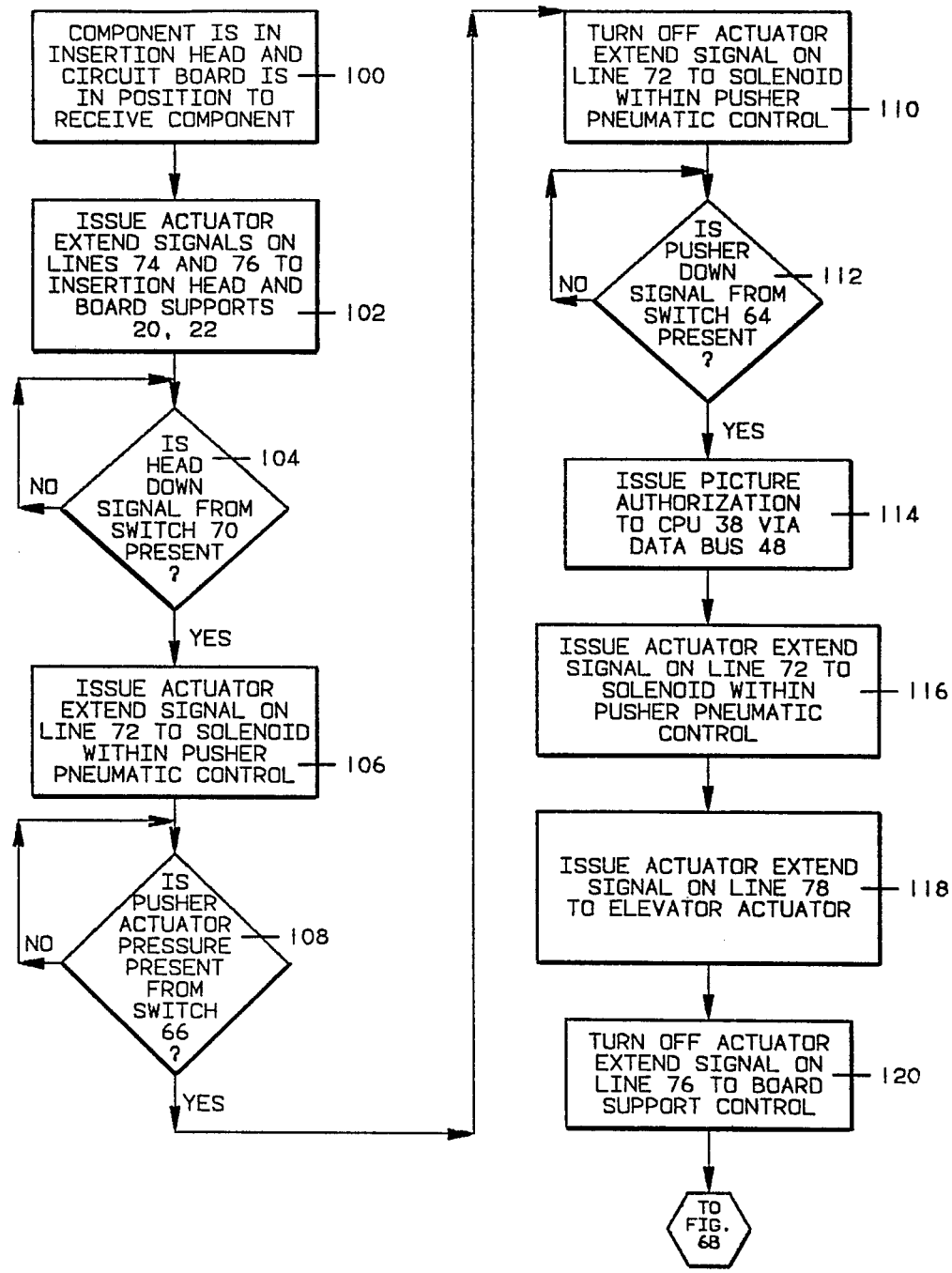
FIGS. 6A and 6B illustrate the operation of a first central processor unit within the system of FIG. 4 which controls certain elements of the component insertion machine.
Figure 6B:
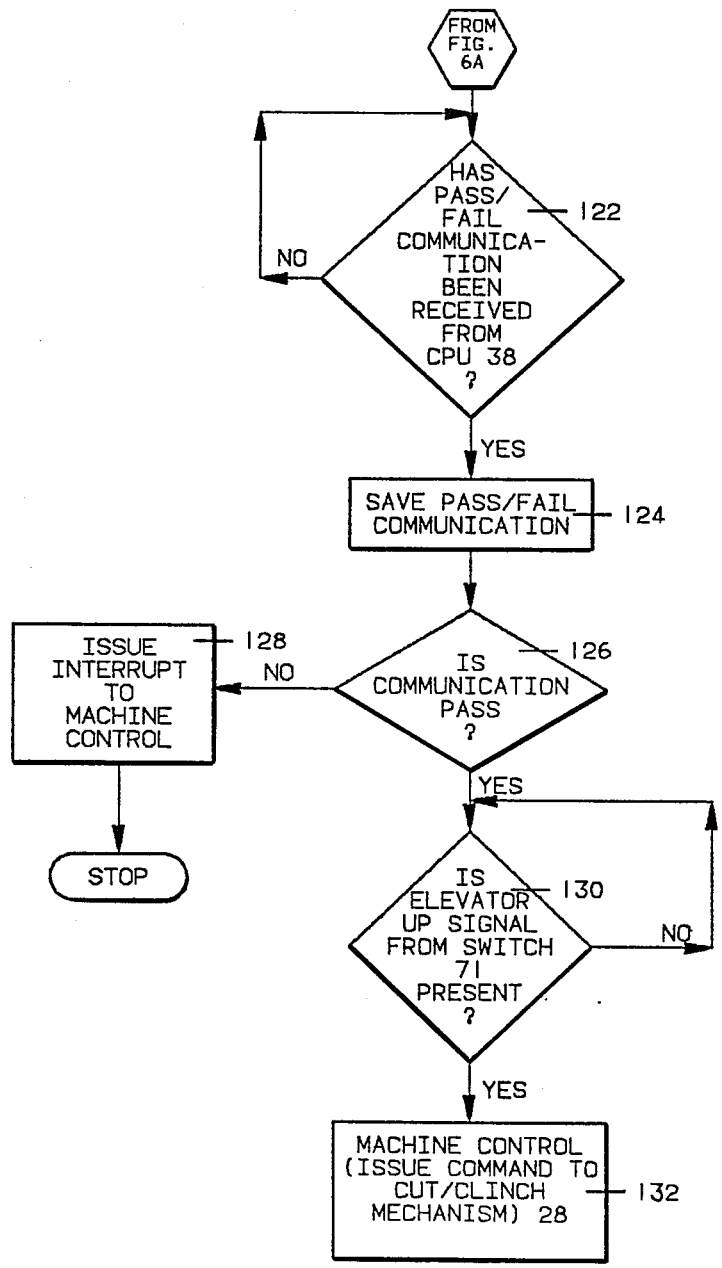

Referring now to FIGS. 6A and 6B, the operation of the central processor unit 36 during the control sequence of the aforementioned machine elements is illustrated. It is to be appreciated that the control sequence depicted in FIGS. 6A and 6B is but a portion of a much larger program wherein the complete control of a component insertion machine is addressed. In this regard, the first step 100 in the flow chart of FIG. 6A requires that a component be in place within the insertion head and that the circuit board 16 be appropriately positioned relative to the insertion head for receipt of the thus held component. At point in the machine control the central processor unit 36 proceeds to step 102 and issues actuator extend signals on lines 74 and 76. This is implemented by addressing the appropriate output lines on the I/O circuit 62 via the multibus 44. The signals thus present on the lines 74 and 76 cause the insertion head to move downwardly towards the printed circuit board 16 whereas the board supports 20 and 22 move up into place underneath the printed circuit board 16. The central processor unit now awaits a signal from the switch 70 indicting that the insertion head is in a downward position as indicated in a step 104. At this time, the central processor unit issues an extend signal on the line 72 to the solenoid controlled valve associated with the pusher pneumatic control. The central processor 36 now awaits in a step 108 for an indication from switch 66 that the pusher actuator pressure is at a predetermined level. This level has been arbitrarily predetermined as the level of pressure necessary to allow the pusher element 18 to exert a downward pressure on the component 10 sufficient to seat the component without deflecting the printed circuit board downwardly. The central processor unit 36 now inquires as to whether the pusher element 18 is in a downward position in a step 112. This indication will be provided to the I/O circuit 60 via the switch 64. It is to be noted that while the pusher element 18 will thus be in a downward position, the amount of pressure thus exerted on the component will not be sufficient to deflect the printed circuit board due to the deactivation of the pneumatic control for the pusher element in step 110. It is to be appreciated that the leads of the component 10 should be extending through the holes underneath the printed circuit board 16 at this time.

The central processor unit 36 now issues a picture authorization signal to the central processor unit 38 via the databus 48 in a step 114. The central processor unit 36 then issues in a step 116 another actuator extend signal on the line 72 to the solenoid controlled valve associated with the pusher pneumatic control. This signal causes the pusher element to again push downwardly with appreciable force on the component 10. While the component is thus being further pushed against the circuit board 16, the central processor unit 36 issues an extend signal on a line 78 to the solenoid controlled valve within the pneumatic control for the elevator actuator for the cut and clinch mechanism 28. This is accomplished in a step 118 wherein the extend signal to the elevator actuator is initiated. The central processor 36 in a step 120 now turns off the actuator extend signal on the line 76 to the pneumatic control for the board supports 20 and 22. The central processor unit 36 now awaits a signal from the central processor unit 38 as to whether the component has passed or failed the test for all inserted leads being detected. This is accomplished in a step 122 in FIG. 6B. The pass/fail communication is saved in a step 124 and thereafter analyzed in a step 126. In the event that the communication indicates a failure, the central processor 36 exits to a step 128 and alerts the main machine control to issue a stop. In the event that a pass communication is noted, the central processor 36 proceeds to a step 130 and asks whether the elevator up signal is present from the switch 71. This occurs when the cut/clinch mechanism has moved up into position for cutting and clinching the inserted leads of the component 10. When this occurs, the central processor proceeds to a step 132 wherein a normal machine sequence occurs. In this regard, the cut and clinch mechanism 28 is activated and the leads are appropriately cut and clinched. All elements are thereafter returned to their initial position in preparation for handling the next component that is to be inserted.

It is to be appreciated that the operation of the central processor unit 36 disclosed in FIGS. 6A and 6B is specific to a particular component insertion machine. Other machine control systems having different approaches to the positioning of a component and insertion of leads into a printed circuit board may also be used with the image analysis system 34. In this regard the image analysis system 34 must merely know when the leads have been fully inserted into the holes of the printed circuit. This can be accomplished by transmitting a signal to the central processor unit 38 at such time as an analysis is to be made of the inserted leads.

Figure 7A:
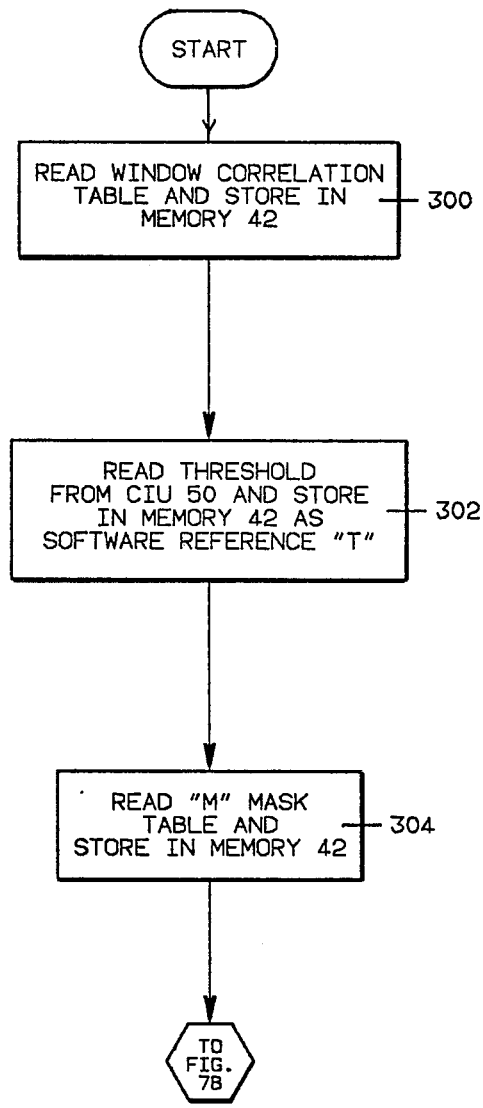
FIGS. 7A and 7B illustrate the overall operation of a second central processor used within the system of FIG. 4 which implements the image analysis.

Referring now to FIG. 7A, a flow chart of the initial steps of the image analysis process is illustrated. The process begins with steps 300 to 306 wherein certain information is initially read into the memory 42. This information can be obtained from any external source to the CPU 38 including the terminal 60. In the preferred embodiment however, this information is obtained from a read-only memory associated with the CPU 38. This memory is merely addressed and the information is thereafter transferred via the multibus 46 to the memory 42.

Step 300 relates to the accessing and storing of the window correlation table. This table has been previously discussed with regard to FIG. 5. The window correlation table will be a cross correlation between lead count and window index value. Step 302 relates to the reading of a threshold value for the CIU 50. It will be remembered that this defines what analog voltage level from the camera 24 is to be used as the cross-over point between a light and dark image connotation. In this regard voltages higher than the threshold value will be interpreted by the CIU 50 as light or a binary zero. Voltages less than or equal to the threshold value will be interpreted by the CIU 50 as dark or binary ones.

Step 304 involves the reading into memory of an "M" mask table which has not been heretofore discussed. This table consists of a number of eight bit masks that are to be successively applied to certain bit strings of information in a manner that will be described in detail hereinafter.

Figure 7B:
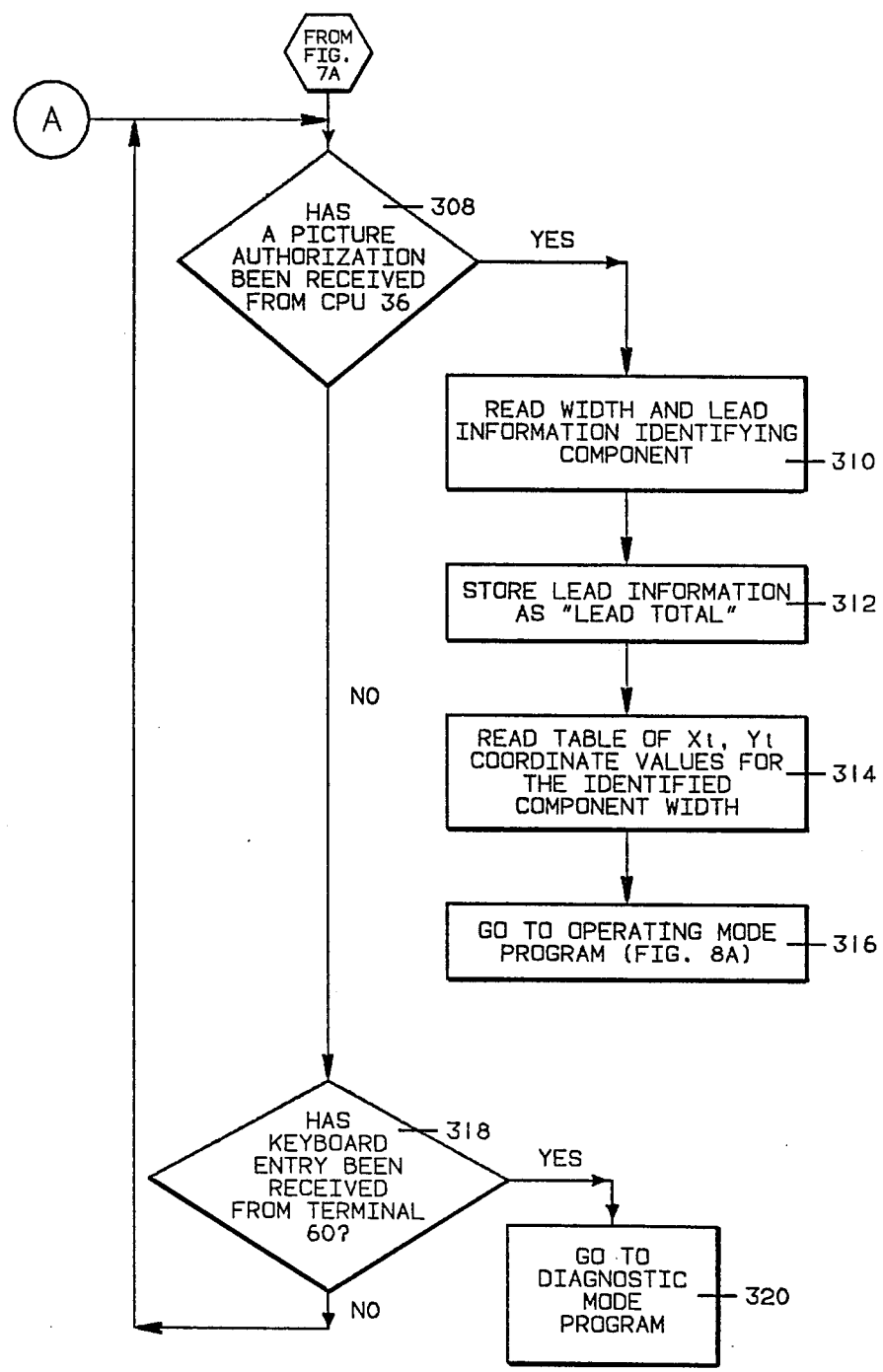

In the following step 308 appearing in FIG. 7B, the central processor 38 awaits a picture authorization communication from the CPU 36 via the bus 48. When a picture authorization is received, the central processor 38 pursues the "yes" path to a step 310 and reads the width and lead information identifying the component whose leads have been inserted The central processor 38 thereafter stores the lead information as a numerical value in the software variable "lead total" in step 312. The central processor also reads the table of $X_i$, $Y_i$ coordinate values for the identified component width in a step 314. The table $X_i$, $Y_i$ coordinates will be the coordinate values for each window $W_i$. The central processor 38 now proceeds to a step 312 and exits to an operating mode program which will be discussed in detail hereinafter. For the moment it is merely to be noted that the operating program will analyze the picture authorized in step 308 for the presence of the leads indicated in step 310.

Referring again to step 308, in the event that a picture authorization is not received, the central processor unit 38 merely awaits a keyboard entry from the terminal 60 in a step 318. In the event that a keyboard entry is made, the central processor unit 38 exits to a diagnostic program in a step 320. A diagnostic program responsive to various keyboard entries has been previously disclosed in U.S. application Ser. No. 797,322. The diagnostic program adjusts coordinates of twenty windows within an image field. A diagnostic program employing essentially the same algorithms modified for the increased number of windows illustrated in FIG. 5 would be used to realign any or all of the windows of FIG. 5. In this manner each window would be aligned with respect to one of a maximum of forty leads appearing in the image field. In each case the exit from the diagnostic program would be to the re-entry point A in FIG. 7B.

Following any adjustment that may be necessary to the windows of FIG. 5, the central processor 38 will return through the re-entry point A and await a picture authorization in step 308, The central processor 38 will then exit to an operating program when this occurs.

Figure 8A:
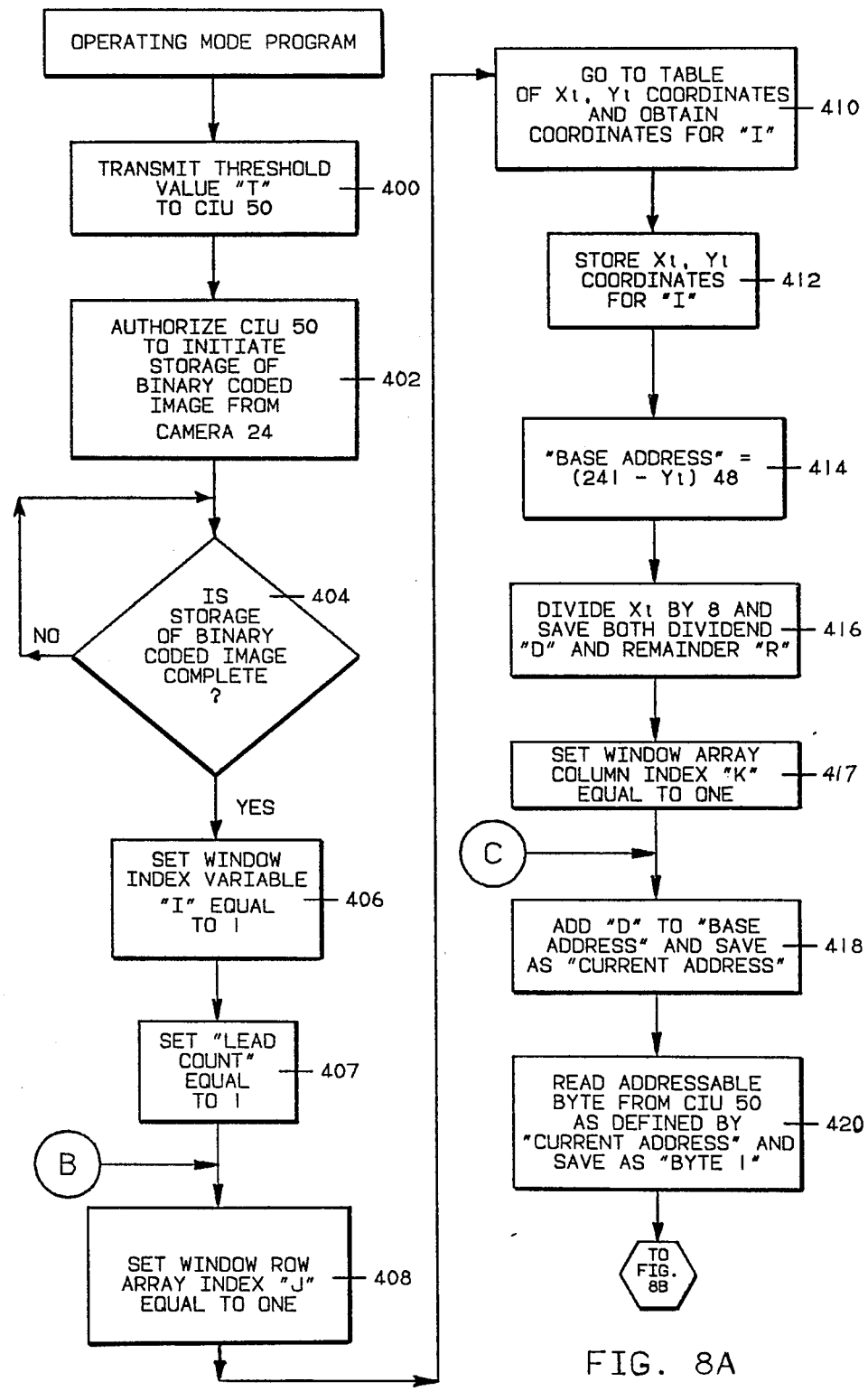
FIGS. 8A through 8F illustrate the operation of the second central processor in implementing an operating mode program.
Figure 8B:
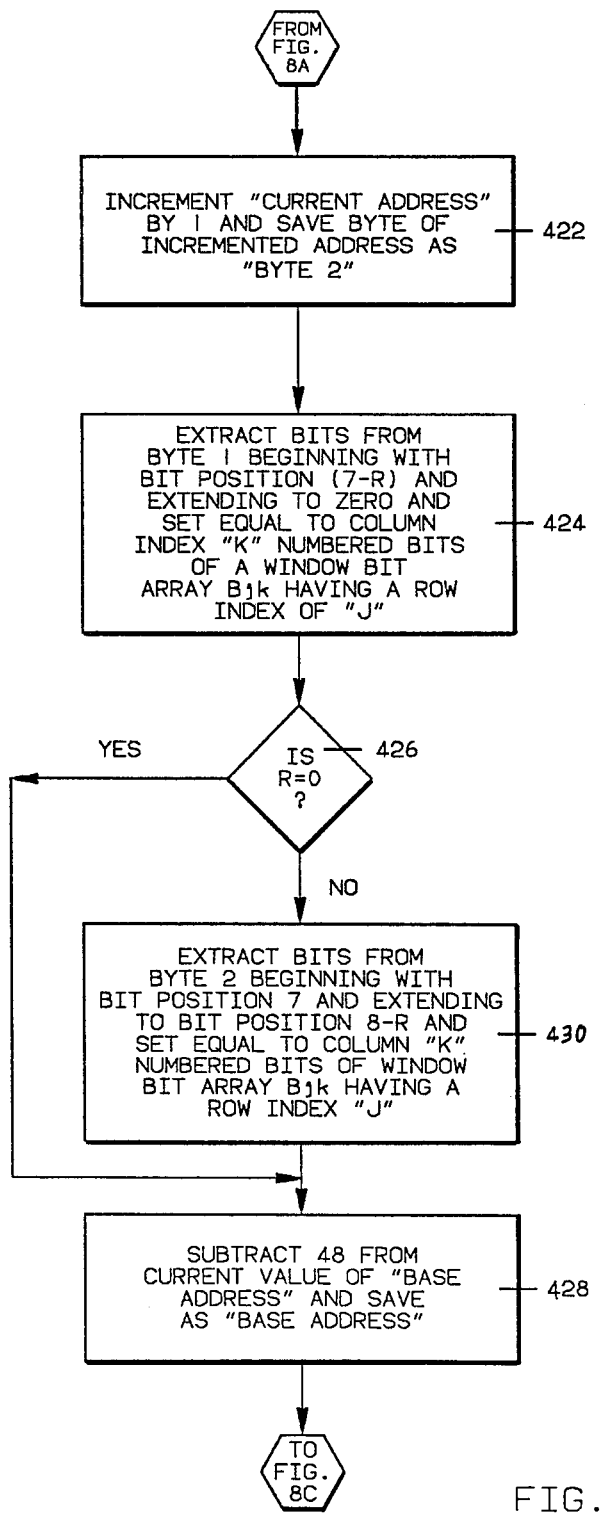
Figure 8C:
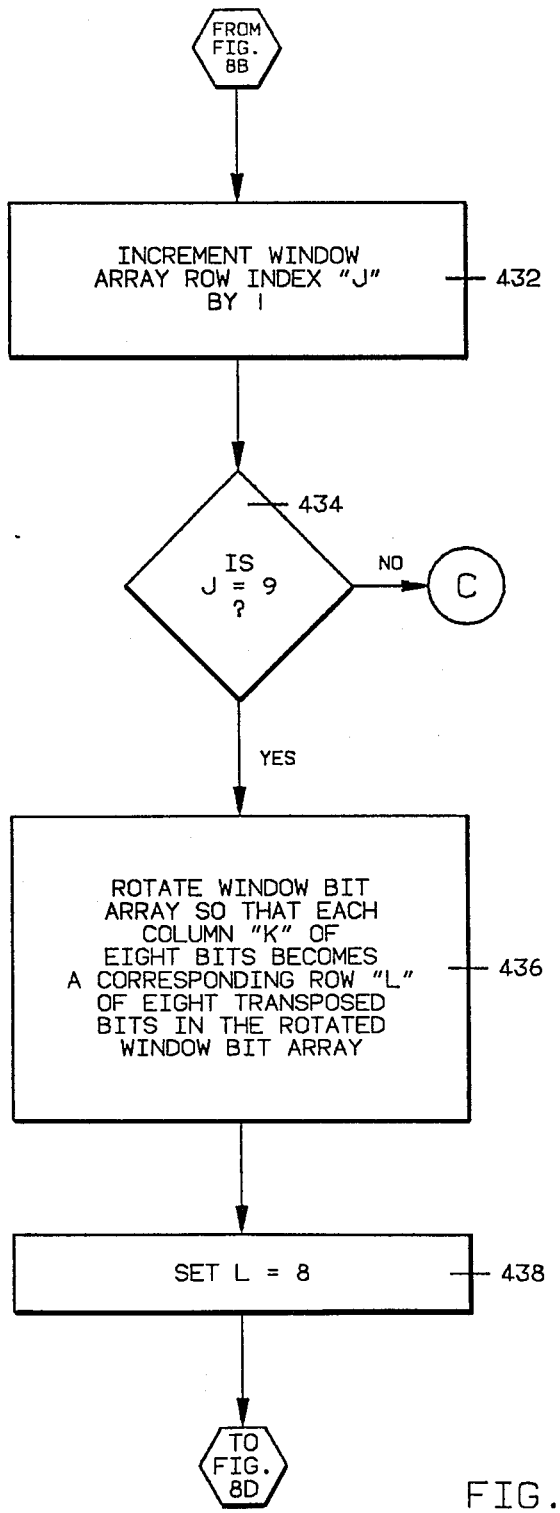

Referring to FIG. 8A, the operating mode program begins with a step 400 wherein the threshold value (initially stored in the software reference "T" in step 304) is transmitted to the CIU 50. It will be remembered that this threshold value is used by the CIU to determine whether a particular pixel voltage from the camera 24 is to be interpreted as a dark or light signal. Each so characterized pixel voltage is stored as either a binary one (dark) or binary zero (light) in step 402. The central processor unit 38 proceeds to a step 404 and awaits the completion of this storage. This will be indicated to the central processor 38 by a status signal from the CIU 50. At this point in time there will be a complete storage of the entire array of 384 by 242 pixel bits in a randomly addressable memory within the CIU 50. These pixel bits will be stored in the CIU memory as addressable bytes in accordance with the addressing scheme previously discussed relative to FIG. 5. Following storage of the binary coded image in pixel bit form, the central processor 38 proceeds to a step 406 and sets the window index variable "I", equal to one. The central processor 38 then proceeds to a step 407 and sets the "lead count" variable equal to one. The central processor 38 now proceeds to a step 408 and sets a window row array index "J" equal to one. It is to be noted that this index will always be set equal to one each time the central processor returns to the step 408 via a return point B. The central processor 38 proceeds from step 408 to a step 410 and obtains the $X_i$ and $Y_i$ coordinates for the current value of the window index variable "I". Since this variable is initially set equal to one in step 406, the first pass through step 410 will result in the coordinates $X_1$ and $Y_1$ being obtained. These coordinates will be stored in step 412. The central processor 38 now proceeds to a step 414 and calculates a "base address" using the coordinate value of $Y_i$. It will be remembered that this address defines the first addressable byte in any given Y-row in FIG. 5. The central processor 38 now proceeds to a step 416 and divides the $X_i$ coordinate value by eight and saves both the dividend "D" and the remainder "R" of this division operation. The Dividend "D" is thereafter added to the "base address" and saved as a "current address" in a step 418. The central processor 38 now proceeds to a step 420 and reads the addressable byte of information from the CIU 50 as defined by the current address. This byte of information is saved as a "byte 1". The central processor 38 now proceeds to a step 422 in FIG. 8B and increments the value of the current address by one. The addressable byte in the CIU defined by the thus incremented address is stored as a "byte 2". It is to be appreciated that the steps 418 through 422 have located two bytes of information in the CIU memory which contain the pixel bits for the bottom-most row of pixels in the first window $W_1$. It will be remembered that these window pixel bits will be eight in number. It, therefore, remains to isolate the particular eight pixel bits from the bytes identified as byte 1 and byte 2. The extraction of meaningful pixel bits from these two bytes begins with a step 424 wherein the bits of byte 1 beginning with bit position 7-R are extracted. This effectively disregards any bits in byte 1 that are not a pixel bit within the window. Each extracted bit is stored as a particular bit in a window bit array $B_{jk}$. In particular, the first bit to be extracted in step 424 will be stored as a bit $B_{11}$ whereas the second extracted bit will be stored as a bit $B_{12}$. This will continue until the bit of byte 1 corresponding to bit position zero is stored as a bit in the window bit array. It is to be noted that if "R" equals zero then all eight bits of byte 1 will have been stored as a row of bits in the window bit array. In this case the central processor 38 will proceed through a step 426 to a step 428 and compute a new base address of the next row of bits. The central processor 38 will otherwise proceed to a step 430 and extract the bits out of byte 2 beginning with bit position 7 and extending to bit position 8-R. The thus extracted bits are stored as the last remaining bits in the particular row of bits of the window bit array currently being formed. In other words, the last bit to be extracted from byte 2 will become bit $B_{18}$ in the window bit array. The central processor 38 will now proceed to step 428 and calculate a new base address for the next row of pixel bits to be examined for particular window bits. The central processor 38 will then proceed to step 432 and increment the window array row index "J" by one. This will allow the next extracted bits from bytes 1 and 2 to be stored in row 2 of the window bit array. This occurs when the central processor 38 proceeds through step 434 back through the re-entry point C to step 418 in FIG. 8A and again calculates the appropriate addresses for bytes 1 and 2 in steps 420, 422 and thereafter extracts the appropriate window bits in steps 424, 426 and 430. The appropriate row of bits within the window bit array $B_{jk}$ is formed upon the reiteration of these steps through to and including the formation of row eight. At this point the central processor 38 proceeds through the step 434 to a step 436.

Figure 8D:
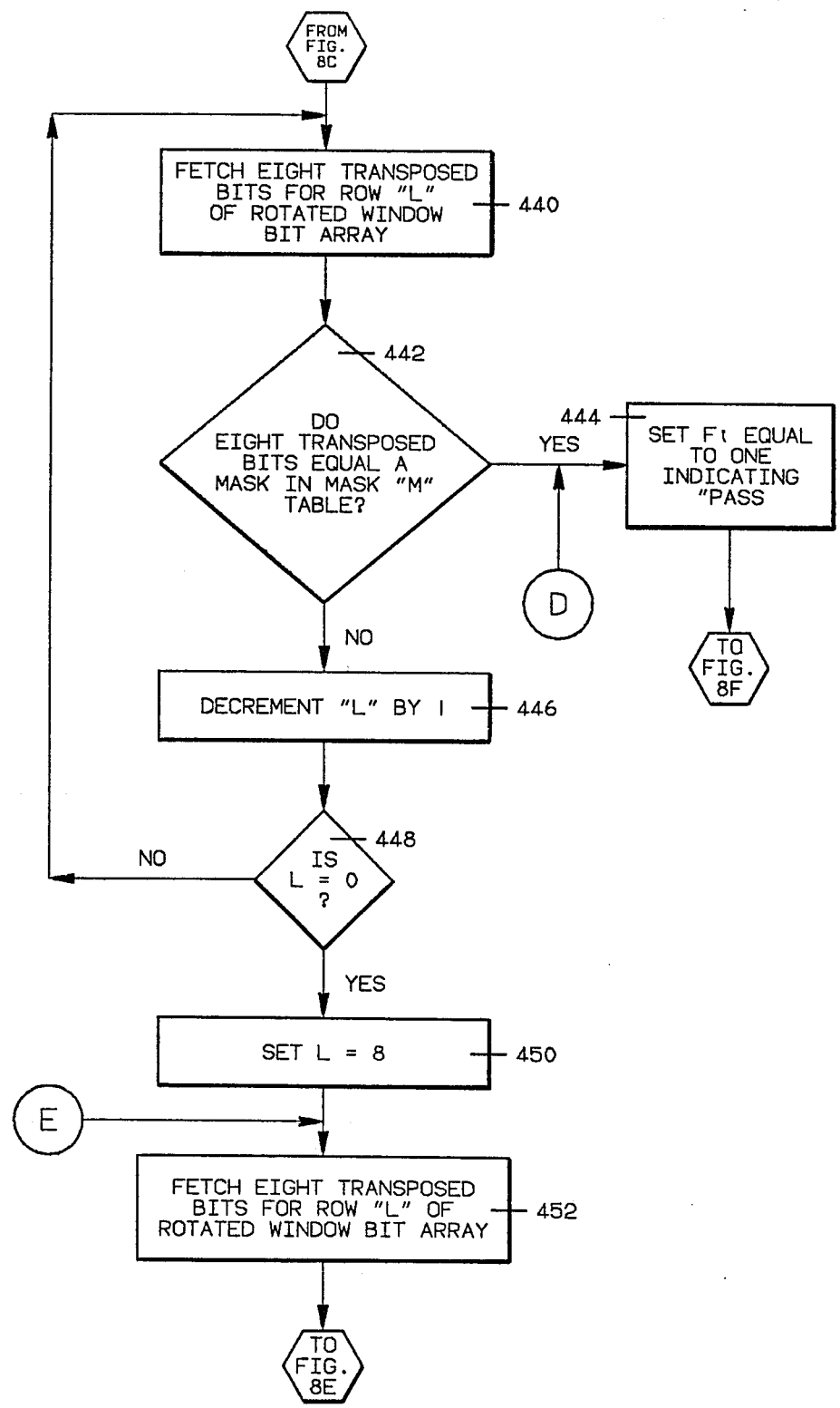
Figure 8E:
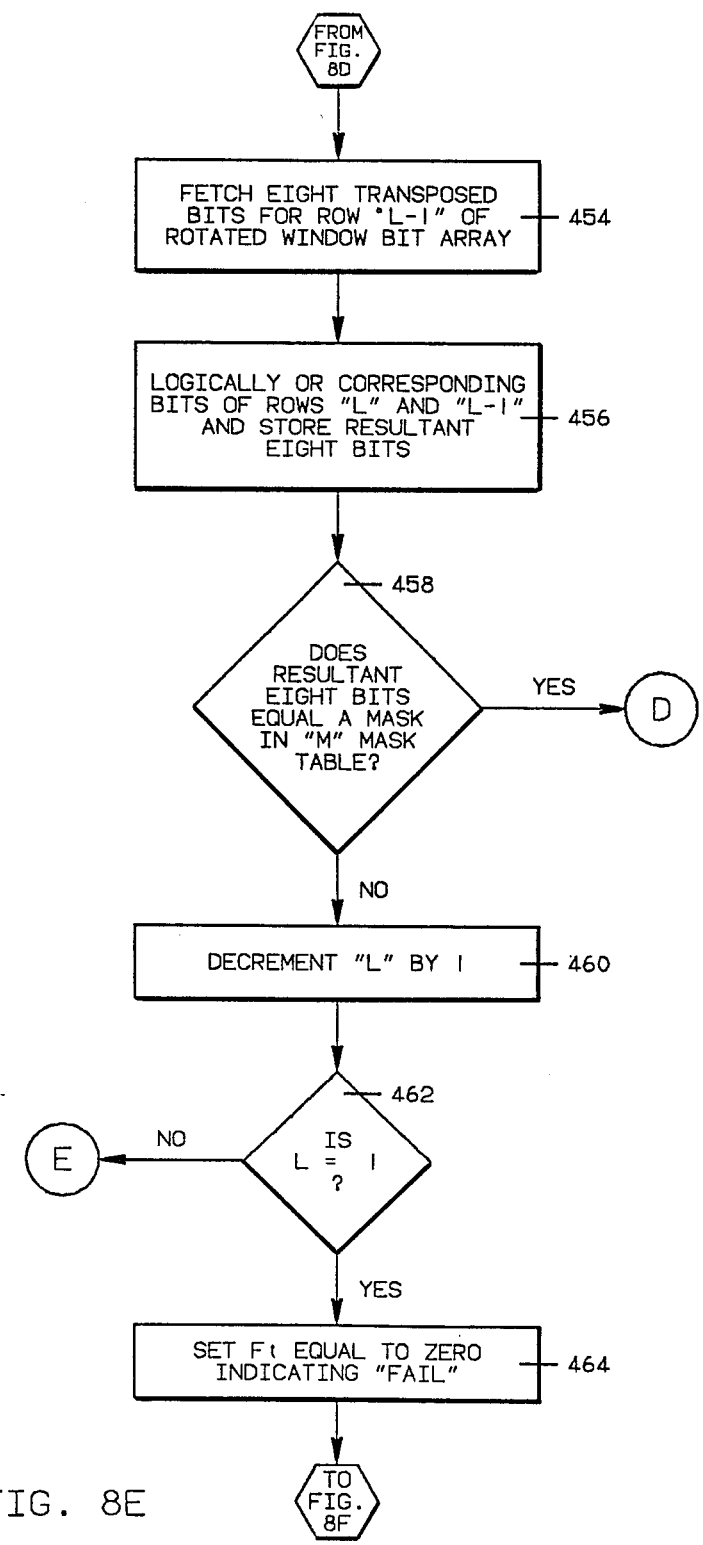
Figure 9:
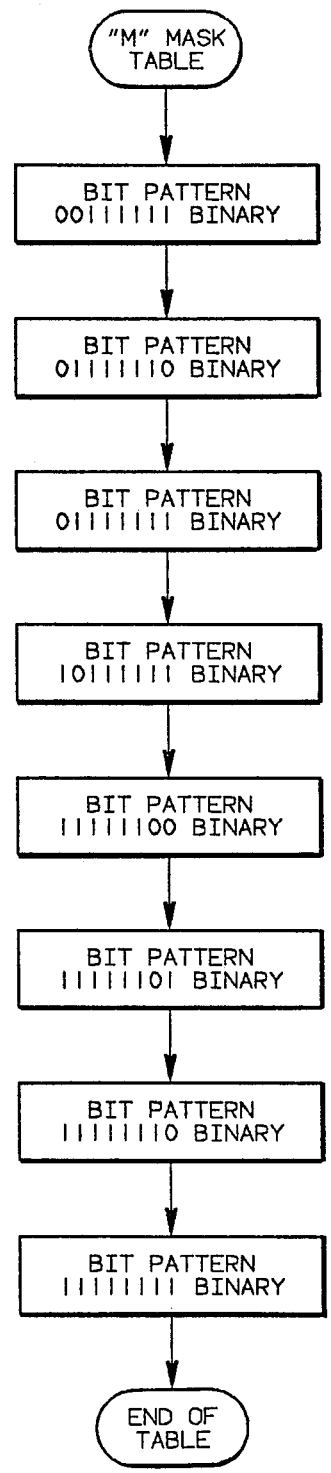
FIG. 9 illustrates a bit pattern masking comparison implemented within the operating mode program of FIGS. 8A through 8F.

Referring to step 436, the window bit array is rotated so that each previously formed column of window bits becomes a correspondingly numbered row in a rotated window bit array. In this manner, the first column of bits in the previously formed window bit array will become the first row in the rotated array whereas the eighth column will become the eighth row. The new rotated column or row index is "L". The "L" index is set equal to eight in step 438 and the eight transposed bits comprising row eight of the rotated window bit array are fetched in step 440. The central processor 38 now proceeds to a step 442 wherein the eight transposed bits are successively compared with bit pattern masks illustrated in an "M" mask table of FIG. 9. Referring to FIG. 9, it is to be noted that each of the bit pattern masks defines a bit pattern having at least six consecutive binary one bits. In the event that the fetched bits compare to any of these masks, the central processor will proceed to a step 444 in FIG. 8D and set a test flag "$F_i$" equal to one indicating that at least one rotated column of window bits from the window bit array $B_{jk}$ has been found to have at least six successive binary one bits. Since the test flag "$F_i$" is itself indexed by the window index "I", the particular test flag will be specific to the window then under examination. Referring again to step 442, in the event that the particular fetched bits of step 440 do not contain six consecutive binary one bits, then the central processor 38 will proceed to a step 446 and decrement the "L" index. The process defined by steps 440, 442 and 446 will again be repeated by virtue of step 448. The next rotated column of window bits indicated by the new "L" will be fetched and compared with the "M" masks. This reiteration will continue until either a rotated column is found to have six consecutive binary one bits or all eight rotated columns have been examined. In the latter event, the "L" index will have been decremented to zero causing the central processor to proceed through step 448 to step 450 wherein the index "L" is again set equal to eight. The central processor now fetches both the rotated column of window bits identified by "L" in a step 452 as well as the next rotated column of window bits identified by "L−1" in a step 454. These two successively fetched rotated columns of eight bits each are now logically ORed together in a step 456. The resultant eight bits are now compared in a step 458 with each of the bit pattern masks in the "M" mask table of FIG. 9. In the event that the resultant eight bits contain six consecutive binary one bits, then the central processor 38 immediately proceeds out of step 458 to the step 444 in FIG. 8D via their re-entry point D. This indicates that at least two successive columns of the window bit array $B_{jk}$ can be combined to show a continuous string of six consecutive binary one bits. In other words, if a binary one bit is missing from a bit position in one column of the window bit array $B_{jk}$ but found in the corresponding bit position of the immediately adjacent column, then the logical OR operation of step 456 will have produced a binary one bit in the resultant eight bit string being compared with the "M" masks in FIG. 9. This will constitute a "pass" condition being indicated by the test flag "$F_i$" in step 444. Referring again to step 458 in FIG. 8E, if the resultant eight bits formed in step 456 do not indicate a continuous string of at least six consecutive binary one bits, then the index "L" is decremented in step 460 and the process of steps 452, 454, 456 and 458 is again repeated in a step 462 and re-entry point E. This continues to occur until either six consecutive binary one bits are found in two combined adjacent columns of the window bit array or the index "L" has been decremented to one. In the latter case the central processor 38 proceeds through step 462 to a step 464 and sets the test flag "$F_i$" equal to zero indicating a "fail" condition.

Figure 8F:
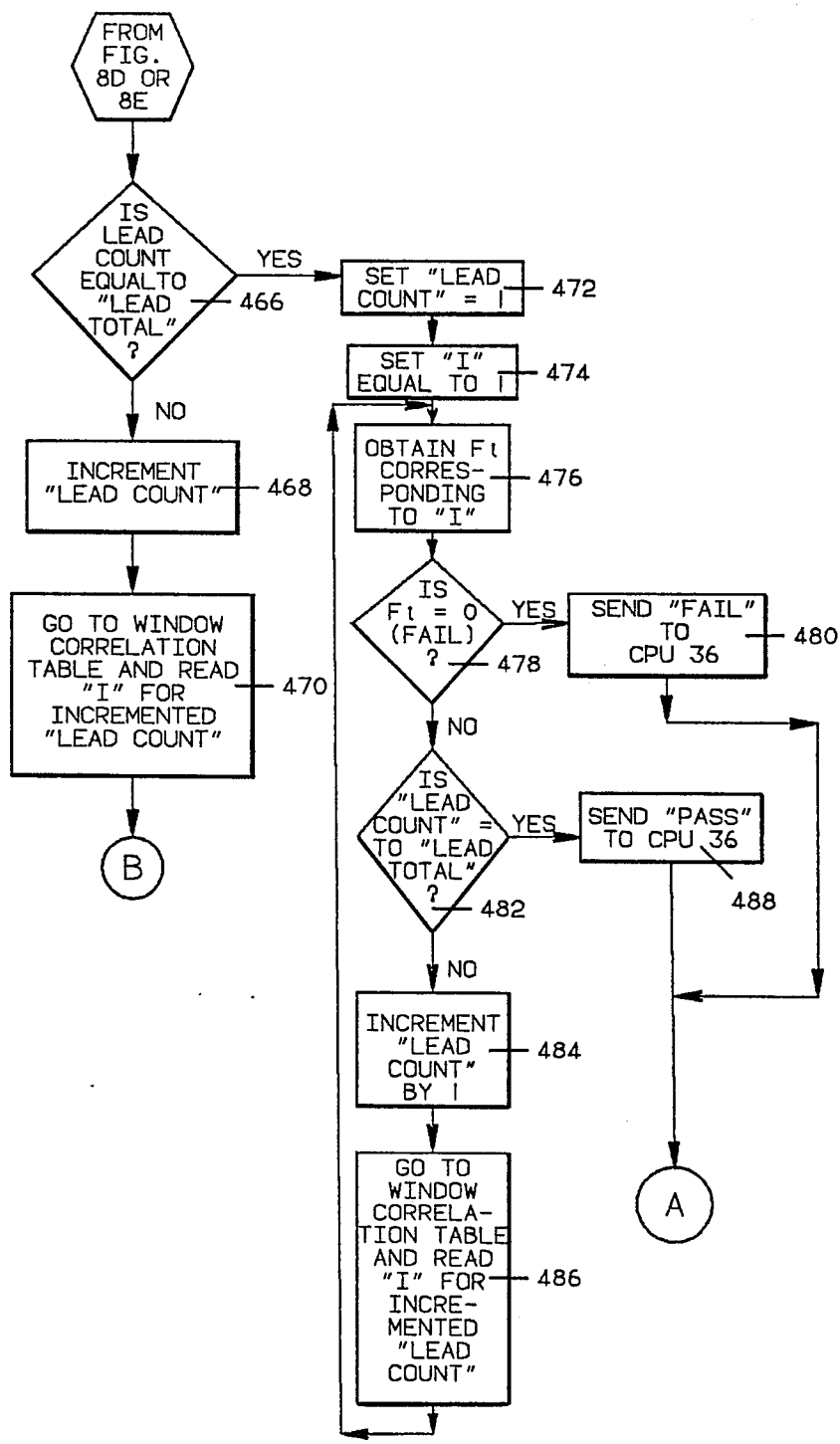

It is to be noted that regardless of whether the test flag "$F_i$" is set equal to zero in step 464 or set equal to one in step 444, the central processor 38 will always proceed from either step to a step 466 in FIG. 8F.

Referring to step 466 in FIG. 8F, the central processor 38 compares the current value of "lead count" to the value of "lead total". In this regard, it will be remembered that "lead total" is defined in a step 312 as the number of leads for the component that is being inserted. It will also be remembered that the software variable "lead count" is initially set equal to one in a step 407. Since most components will have several leads, the central processor will proceed to increment "lead count" in a step 468. The incremented "lead count" of step 468 will now be used in a step 470 to define the next window which is to be examined for the presence or absence of a lead. In this regard the central processor 38 will proceed to the window correlation table and read the value of "I" for the incremented "lead count" of step 468. The central processor 38 will now proceed via return point B to FIG. 8A and again initialize the window row index "J" equal to one in step 408. The central processor will then proceed to go to the table of $X_i$, $Y_i$ coordinates and obtain the coordinates for "I". These coordinates will be stored in step 412 and the "base address" for the $Y_i$ coordinate will be calculated in step 414. The $X_i$ coordinate will be divided by eight in step 416 and both the dividend "D" and the remainder "R" will be saved. The two bytes within the $Y_i$ row will then be identified and the eight window bits within these two bytes will be extracted and set equal to the first row of the newly constructed window bit array $B_{jk}$. Following construction of each row of the window bit array, the columns will be rotated and examined for six consecutive binary one bits in any one column or in the resultant eight bits formed by combining two adjacent columns by the logical OR operation of step 456. The test flag "$F_i$" for the particular window under examination will either be set equal to one in step 444 or set equal to zero in step 464 before returning to step 466 in FIG. 8F. The central processor 38 will continue through the above steps until such time as the "lead count" equals "lead total" in step 466. At this time the central processor 38 will proceed to a step 472 in FIG. 8F and again set the software variable "lead count" equal to one. The central processor 38 then proceeds to set "I" equal to one in a step 474 and obtains the particular "$F_i$" corresponding to the value of "I" in step 476. The value of the thus obtained "$F_i$" is checked for a failure condition in a step 478. In the event that the currently examined "$F_i$" has a value of zero, the central processor 38 will immediately exit to a step 480 and transmit a "fail" signal to central processor 36. On the other hand, if a given "$F_i$" is equal to one, the central processor will proceed to a step 482 and check as to whether "lead count" equals "lead total". In the event that the "lead count" remains less than "lead total", the central processor will proceed to increment the "lead count" in a step 484 and read the current value of "I" for the incremented "lead count" in step 486. The "$F_i$" corresponding to the thus incremented value of "I" will be obtained in step 476 and analyzed as to failure in step 478. This will continue to occur until such time as a particular "$F_i$" is equal to zero or until the "lead count" is equal to "lead total". In the latter event, the central processor 38 will exit from step 482 to a step 488 and send a "pass" message to the central processor 36.

Following the transmission of either a "pass" or "fail" message to central processor unit 36 via steps 488 or 480, the central processor 38 will proceed via re-entry point A in FIG. 7B and again await either a picture authorization from CPU 36 or a keyboard entry from terminal 60.

If the component insertion machine is in a normal mode of inserting components, then a picture authorization signal will be received in a step 308 and the image analysis process will proceed via step 310 and the operating program of FIGS. 8A through 8F will take place.

It is also of course to be noted that in the event that the operator wishes to adjust or otherwise change the currently displayed window locations, then a keyboard entry on the terminal 60 will prompt the central processor to proceed to the diagnostic program.

It is to be noted that a preferred embodiment of a method and apparatus for analyzing the inserted leads of a component within a component insertion machine have been disclosed. Various portions of the disclosed method and apparatus including the computer programs residing therein may be changed without departing from the scope of the present invention.

We claim:

1. A system for verifying the proper insertion of a row of leads of an electronic component such as a DIP into a printed circuit board prior to securing the leads to the board comprising:
   camera means including a plurality of photosensitive binary elements arranged in horizontal rows to define a two-dimensional array, such elements having a one value when the image sensed is dark and having a zero value when the image sensed is light.
   means for locating the image of each lead having an area of about three photosensitive elements wide by about eight photosensitive elements high within a corresponding discrete window of photosensitive elements defined by about eight consecutive horizontal rows of such photosensitive elements each row having about eight photosensitive elements, thus providing a window of about eight vertical rows by about eight horizontal rows,
   means for determining whether each of the component leads is present, including:
      means for ascertaining whether a selected plurality of consecutive photosensitive elements in one of the vertical rows of photosensitive elements defining each window have a one value indicating that a lead is present,
      means for defining the value of a given photosensitive element from a zero value to a one value when the value of the horizontally adjacent photosensitive element in the next vertical row has a one value, and
      means for verifying the presence of a lead when a selected number of consecutive elements in one of the vertical rows have a one value.

2. A verification system according to claim 1, wherein a lead will be verified as present, by the means for verifying, when six consecutive elements in one of the vertical rows have a one value.

3. A system according to claim 2, wherein the electronic component has two rows of leads and said locating means comprises means for mounting said camera means at an angle to the printed circuit board.

* * * * *